United States Patent [19]

Hung

[11] Patent Number: 4,957,661
[45] Date of Patent: Sep. 18, 1990

[54] GRAPHITE FLUORIDE FIBER POLYMER COMPOSITE MATERIAL

[75] Inventor: Ching-Cheh Hung, Westlake, Ohio

[73] Assignee: The United States of America as represented by the United States National Aeronautics and Space Administration, Washington, D.C.

[21] Appl. No.: 251,499

[22] Filed: Sep. 30, 1988

[51] Int. Cl.$^5$ .............................................. H01B 1/06
[52] U.S. Cl. ................................... 252/510; 423/439; 423/448; 423/460; 423/489
[58] Field of Search ............... 423/439, 448, 460, 489; 252/510; 510/150

[56] References Cited

U.S. PATENT DOCUMENTS

| | | | |
|---|---|---|---|
| 3,414,381 | 12/1968 | Olstowski | 423/448 |
| 3,627,571 | 12/1971 | Cass et al. | 117/118 |
| 3,674,432 | 4/1972 | Margrave et al. | 423/439 |
| 3,728,423 | 4/1973 | Shaffer | 264/29 |
| 3,872,032 | 3/1975 | Kanemaru et al. | 423/439 |
| 3,878,274 | 4/1975 | Murayama et al. | 264/2 |
| 3,881,977 | 5/1975 | Dauksys | 156/242 |
| 3,929,920 | 12/1975 | Komo et al. | 260/653.9 |
| 3,931,392 | 1/1976 | Deitz | 423/447 |
| 4,259,278 | 3/1981 | Flegel et al. | 264/81 |
| 4,289,168 | 9/1981 | Lecourt et al. | 138/109 |
| 4,338,181 | 7/1982 | Solomon | 204/294 |
| 4,343,843 | 8/1982 | Johnson et al. | 428/36 |
| 4,382,875 | 5/1983 | Solomon | 252/425.3 |
| 4,423,261 | 12/1983 | Watanabe et al. | 570/150 |
| 4,426,339 | 1/1984 | Kamath et al. | 264/22 |
| 4,438,086 | 3/1984 | Aramaki et al. | 423/448 |
| 4,592,883 | 6/1986 | Yamada | 264/82 |
| 4,753,786 | 6/1988 | Watanabe et al. | 423/439 |
| 4,795,624 | 1/1989 | Nalewajek | 423/439 |

FOREIGN PATENT DOCUMENTS

| | | | |
|---|---|---|---|
| 58-20706 | 2/1983 | Japan | 423/439 |
| 2104883 | 3/1983 | United Kingdom | 423/448 |
| 2111472 | 7/1983 | United Kingdom | 423/489 |
| 132611 | 2/1985 | United Kingdom | 423/439 |

OTHER PUBLICATIONS

"Effects of Sequential Treatment with Fluorine and Bromine on Graphite Fibers", NASA TM 100106.

Primary Examiner—Olik Chaudhuri
Assistant Examiner—Robert M. Kunemund
Attorney, Agent, or Firm—Gene E. Shook; James A. Mackin; John R. Manning

[57] ABSTRACT

Improved graphite fluoride fibers are produced by contact reaction between highly graphitized fibers and fluorine gas. It is preferable to intercalate the fibers with bromine or fluorine and metal fluoride prior to fluorination.

These graphite fluoride fibers are bound by an epoxy. The resulting composites have high thermal conductivity, high electric resistivity, and high emissivity.

7 Claims, 2 Drawing Sheets

GRAPHITE FLUORIDE FIBER POLYMER COMPOSITE MATERIAL

ORIGIN OF THE INVENTION

The invention described herein was made by an employee of the United States Government and may be manufactured and used by S or for the Government for governmental purposes without the payment of any royalties thereon or therefor.

TECHNICAL FIELD

This invention is concerned with solving heat transfer problems encountered in electric and electronic applications. The invention is particularly concerned with graphite fluoride fibers and graphite fluoride fiber-polymer composite materials together with their manufacture.

In many applications it is desirable to have a material which has both high thermal conductivity and good electrical insulation characteristics. Diamond crystals have these characteristics and represent the optimum material.

Graphite fluoride is another such material which is commercially available in powder form. It is produced by the direct fluorination of graphite powder at 400° C. to 650° C.

The direct fluorination of graphite fibers at 500° C. results in white fragile graphite fluoride fibers. The thermal conductivity of these fibers is low because they are normally damaged due to their fragility.

Printed circuit boards are fabricated from fiber glass-epoxy composite material. The insulators for the laminated metal disks used in alternators, transformers, or other magnetic circuit cores are fabricated from conventional insulating materials, such as quartz and glass. All of these insulating materials lack high thermal conductivity. Therefore, these conventional insulating materials have heat transfer problems which easily result in overheating.

It is, therefore, an object of the present invention to provide an insulating material having high thermal conductivity with acceptable mechanical properties.

A further object of the invention is to provide an improved composite material for printed circuit boards.

A still further object of the invention is to provide an improved material for spacecraft radiators which is characterized by high emmissivity, high thermal conductivity, chemical inertness, and improved hydrophobic properties.

Another object of the invention is to provide a method of partially fluorinating graphite fibers to produce graphite fluoride fiber composites with predetermined resistivities in the $10^{-2}$ to $10^{11}$ Ω cm range.

BACKGROUND ART

U.S. Pat. No. 3,627,571 to Cass et al is concerned with a method of preparing a graphite fiber-resin matrix to improve the bonding characteristics of the fiber. The process includes the steps of reacting graphite fibers with a halogen gas and a catalyst of a metal halide at temperatures of 150°–600° C. and with epoxy resin.

U.S. Pat. No. 3,881,977 to Dauksys describes a method of fabricating a composite reinforced with graphite fibers which includes the step of heating the graphite fibers under oxidizing conditions at temperatures of 1000°–4500° F. The heated fibers are then coated with a solution of thermoplastic polymer.

DISCLOSURE OF THE INVENTION

The present invention is directed to graphite fluoride fibers and graphite fluoride fiber-polymer composite materials. The invention is further concerned with methods of producing these materials.

Graphite fluoride fibers are prepared by contact reaction between graphite fibers and fluorine gas. In an alternate embodiment the fibers are reacted with bromine at room temperature and then reacted with fluorine gas at 250° C. to 450° C.

Graphite fluoride fiber-polymer composite materials are prepared by combining the graphite fluoride fibers and epoxy or PTFE or polyimide resin. The resulting composites have high thermal conductivity, high electric resistivity, and high emissivity.

BRIEF DESCRIPTION OF THE DRAWINGS

The objects, advantages, and novel features of the invention will be more fully apparent from the following description when read in connection with the accompanying drawings in which.

BEST MODE FOR CARRYING OUT THE INVENTION

Figure 1:
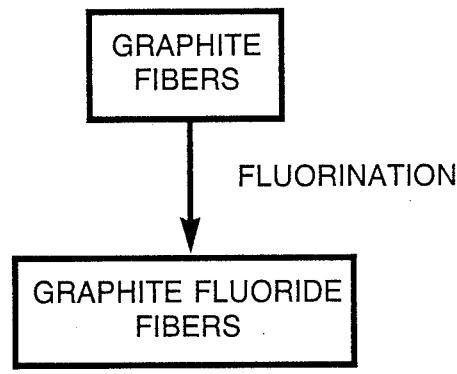
FIG. 1 is a flow chart showing one process for making graphite fluoride fibers in accordance with the invention.

Referring now to the drawings, the flow chart in FIG. 1 shows a process for making graphite fluoride fibers. In this method high quality graphite fibers are directly fluorinated. Highly graphitized fibers are a preferred starting material because after direct fluorination the graphite fluoride fibers that are produced have high thermal conductivity. Pitch-based graphite fibers with diameters of $12\mu$ or less have been satisfactory.

The graphite fibers are fluorinated by exposing their surfaces to fluorine gases at a fluorine partial pressure between ½ atmosphere and 1 atmosphere. This fluorination is carried out at a temperature between 390° C. and 450° C. for up to 21 hours. During fluorination, the temperature may be maintained constant, or this temperature may be increased to decrease the fluorination time. It is further contemplated that this temperature may be raised as high as 600° C. to increase the fluorine content.

ALTERNATE EMBODIMENT

Figure 2:
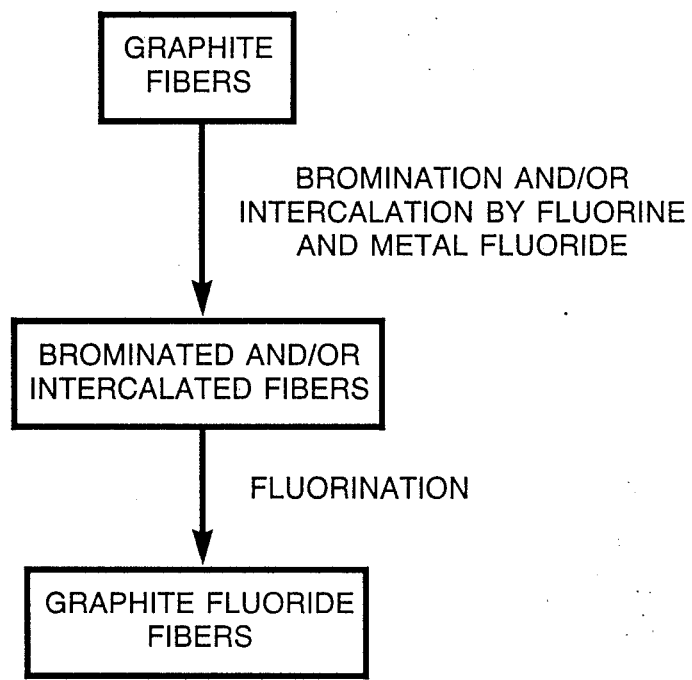
FIG. 2 is a flow chart illustrating the preferred process for making graphite fluoride fibers.

In the preferred process shown in the flow chart of FIG. 2, the graphite fibers are brominated and/or intercalated by fluorine and metal fluoride. The resulting brominated and/or fluorine/metal fluoride intercalated fibers are fluorinated at a fluorine partial pressure between ½ atmosphere and 1 atmosphere. Here again, the process is carried out at a temperature between 250° C. and 450° C. for up to 21 hours. The temperature is usually maintained constant. Alternately, the temperature is raised to about 600° C. to decrease the fluorination time or to increase the fluorine content and, hence, the chemical inertness of the product.

Compared to the embodiment of FIG. 1, the preferred embodiment can react with fluorine at lower temperatures and/or in less reaction time without producing structural damages in the fibers. Thus the product has improved mechanical properties. However, the graphite fluoride fibers produced by the process shown in FIG. 2 may contain materials, such as bromine or metal fluoride. The graphite fluoride fibers produced by either the process shown in FIG. 1 or in FIG. 2 may be white, gray, or black, depending upon the reaction temperature and reaction time.

Graphite powder or graphite fibers of lower quality may be used as raw materials in either the process shown in FIG. 1 or that of FIG. 2. However, the resulting products are of lower quality and reduced cost.

Brominated fibers heated to 800° C. in an inert environment for up to two weeks and graphite fibers intercalated by chemicals other than bromine or fluorine may be used as raw material to produce graphite fluoride fibers. These "intercants" include $FeCl_3$, $CuCl_2$, $SbCl_5$, $AlCl_3/Cl_2$, $HNO_3$, $H_2SO_4$ and mixed halides, such as ICl and IBr.

Figure 3:
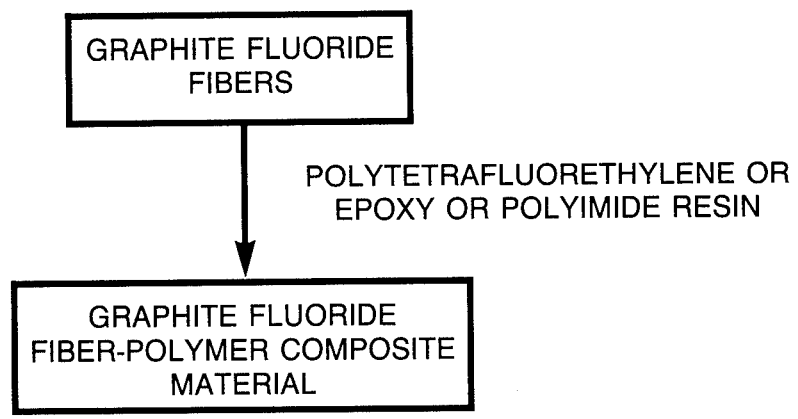
FIG. 3 is a flow chart showing the process for making a graphite fluoride fiber polymer composite material in accordance with the invention.
Figure 4:
FIG. 4 is a photomicrograph at a 390 magnification of a graphite fluoride fiber which has been wetted by an epoxy.

Referring now to FIG. 3, a graphite fluoride fiber polymer composite material is produced by binding the fibers produced by either the process shown in FIG. 1 or that of FIG. 2 with an epoxy. It is contemplated that fibers produced in accordance with the invention described in U.S. patent application Ser. No. 219,016 which was filed on July 14, 1988, likewise may be bound with an epoxy. These fibers are readily wetted by an epoxy as shown in the photomicrograph of FIG. 4. It is further contemplated that fibers may be bound with polytetrafluorethylene (PTFE) or a polyimide resin.

It is still further contemplated that other polymers may be used to produce the polymer-graphite fluoride fiber composite material. These polymers may include polyethylene, polypropylene, acrylic, and polycarbonate materials.

While several embodiments of the invention are disclosed, it is contemplated that various modifications may be made without departing from the spirit of the invention or the scope of the subjoined claims. By way of example, it is contemplated that graphite fluoride powder may be manufactured by using the process shown in the drawing.

I claim:

1. A method of producing graphite fluoride composites comprising the steps of
   brominating highly graphitized pitch-based fibers,
   exposing the surfaces of said fibers to fluorine gas at a fluorine partial pressure between about one-half atmosphere and about one atmosphere at a temperature between about 250° C. and about 450° C. to fluorinate the same for a time sufficient to produce an electrical resistivity in the fibers between about $10^{-2}\Omega$ cm to about $10^{11}\Omega$ cm, and
   combining said fluorinated fibers with a polymer which readily wets the same.

2. A method of producing composites as claimed in claim 1 wherein the brominated fibers are heated to a temperature up to about 800° C. in an inert environment for up to two weeks prior to fluorination whereby the fluorination temperatures and times are decreased without structurally damaging the fibers.

3. A method of producing composites as claimed in claim 1 wherein the highly graphitized pitch-based fibers have diameters of $12\mu$ or less.

4. A method of producing composites as claimed in claim 1 wherein the fibers are exposed to fluorine gas for up to 21 hours.

5. A method of producing composites as claimed in claim 1 wherein the graphite fibers are intercalated by fluorine and metal fluoride prior to fluorination whereby the reaction temperatures and times are decreased without structurally damaging the fibers.

6. A method of producing composites as claimed in claim 1 wherein the graphite fibers are intercalated by a material selected from the group consisting of ICl, IBr, $FeCl_3$, $CuCl_2$, $SbCl_5$, $AlCl_3/Cl_2$, $HNO_3$ and $H_2SO_4$.

7. A method of producing composites as claimed in claim 1 wherein the fibers are wetted and bound by a resin selected from the group consisting of an epoxy, a polytetrafluoroethylene (PTFE), and a polyimide.

* * * * *